United States Patent [19]
Kirklen et al.

[11] B 3,987,390
[45] Oct. 19, 1976

[54] METHOD AND APPARATUS FOR DETERMINING RESISTANCE AT RADIO FREQUENCIES

[75] Inventors: Charles A. Kirklen; Charles F. Rhodes, Jr., both of Richardson, Tex.

[73] Assignee: Sun Oil Company (Delaware), Dallas, Tex.

[22] Filed: Apr. 29, 1974

[21] Appl. No.: 465,393

[44] Published under the second Trial Voluntary Protest Program on January 27, 1976 as document No. B 465,393.

[52] U.S. Cl. ..................................... 324/62; 324/51
[51] Int. Cl.² ......................................... G01R 27/02
[58] Field of Search ................ 324/62, 51, 52, 57 R

[56] References Cited
UNITED STATES PATENTS

| | | | |
|---|---|---|---|
| 2,871,446 | 1/1959 | Wann | 324/62 X |
| 3,163,817 | 12/1964 | Simpson | 324/52 |
| 3,750,016 | 7/1973 | Oakley | 324/62 X |
| 3,769,576 | 10/1973 | Norkaitis | 324/62 X |

Primary Examiner—Stanley T. Krawczewicz
Attorney, Agent, or Firm—J. Edward Hess; Donald R. Johnson

[57] ABSTRACT

The radio frequency resistance between a pair of conductive elements, for example, adjacent pipe sections of a pipeline, which are coupled together through an insulator, may be determined by contacting each pipe section with one of a pair of probes or electrodes connected across the output of a radio frequency oscillator which is coupled to the input of a rectifier and filter circuit. The probes are connected across the oscillator output through a resistor which insures that the direct current output of the rectifier is directly proportional to the RF resistance between the pipe sections. The output of the rectifier is coupled to a meter through an operational amplifier. The meter, which provides a direct readout of the resistance being measured, may be provided with a current limiting circuit which protects the meter from excessive DC current. Calibrating means may be provided to enable adjustment of the gain of the operational amplifier for resistance readings within several ranges.

13 Claims, 1 Drawing Figure

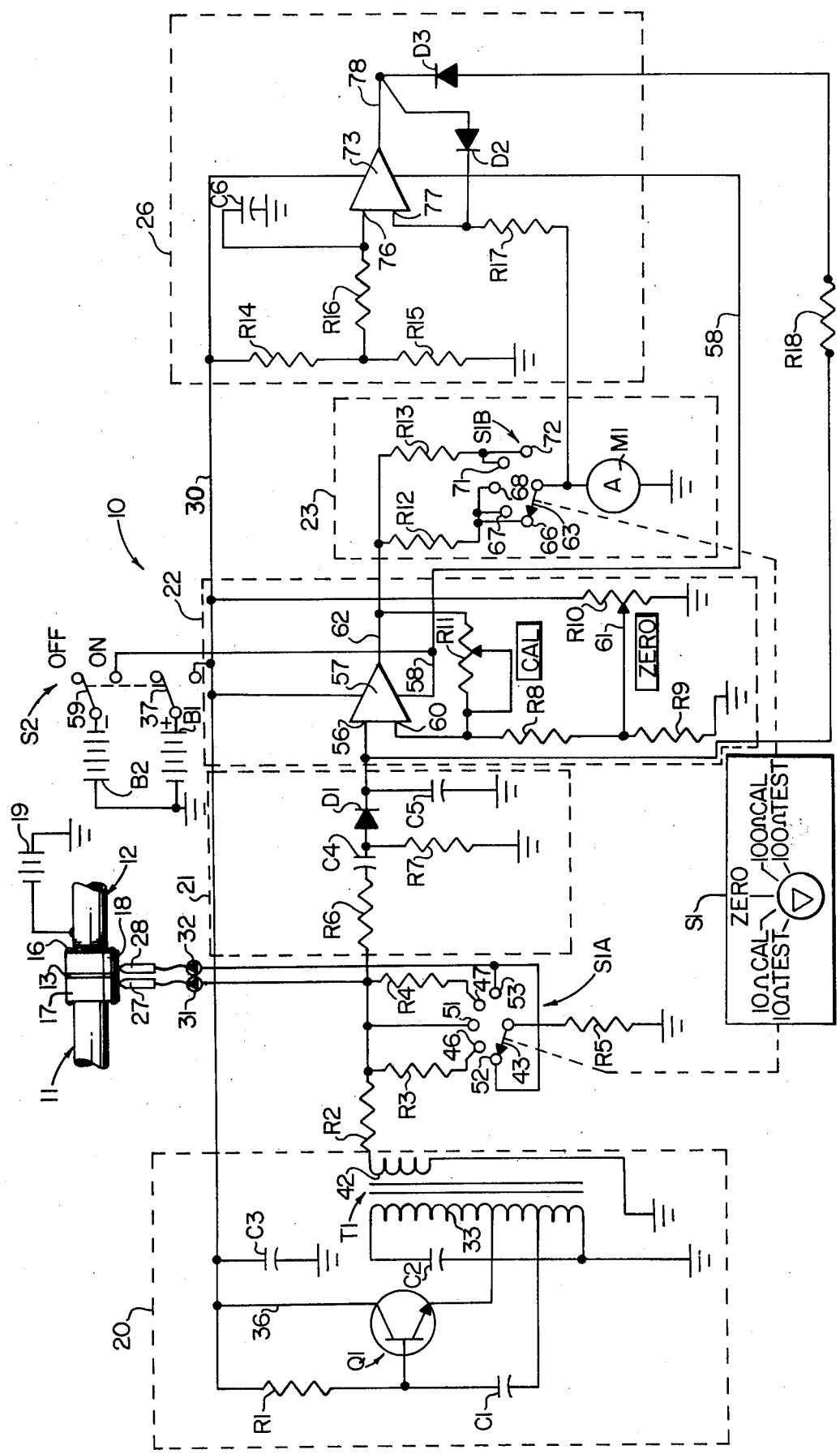

1

METHOD AND APPARATUS FOR DETERMINING RESISTANCE AT RADIO FREQUENCIES

BACKGROUND OF THE INVENTION

1. Field of the Invention

The present invention relates to methods of and apparatus for measuring resistance and more particularly to methods of and apparatus for measuring the resistance between nominally insulated elements at radio frequencies.

2. Technical Considerations and Prior Art

In order to prevent galvanic corrosion of metallic elements, for example, pipes in heterogeneous pipelines for carrying water, oil, gas or the like, it is common practice to impress a small negative DC voltage upon a pipe to supply sufficient electrons thereto so that the pipe becomes a cathode and corrosion reactions are prevented.

It is also common practice to insulate pipe sections from one another by the use of insulating plates or the like. When these insulators deteriorate, break or become contaminated, short circuits occur between adjacent pipe sections through the insulator which divert electrons from one to the other and may render the pipes susceptible to galvanic corrosion. These short circuits may also occur through the insulating plates when adjacent pipe sections are improperly bolted together.

If a DC resistance reading is taken across the adjacent pipe sections through the insulating plate utilizing a conventional DC ohmmeter, the reading on the ohmmeter is representative of the parallel resistances of the adjacent pipe sections both across the insulating plate therebetween and through earth ground, since the pipes are almost always in electrical communication with earth ground. Such readings are virtually meaningless, since the ground to ground DC resistance will cause the meter to read zero or close to zero in every instance. Therefore the insulator must be removed and examined by dismantling the pipe sections.

One prior art solution to the problems associated with detecting short circuits between insulated pipe sections is to apply a radio frequency (RF) voltage between the insulated pipe sections. At radio frequencies the earth will not conduct a current but a contaminated or defective insulator will. Since both the RF and DC resistances of a properly functioning insulator are high and those of a defective insulator are low, this method may be utilized to detect a defective insulator without the necessity of removing it from between the adjacent pipe sections in order to perform a physical examination.

The foregoing method is taught in O. D. Simpson, U.S. Pat. No. 3,163,817. Simpson discloses an RF oscillator, the output of which is coupled to a tank circuit tuned to the oscillator frequency, the output of which is coupled to a milliameter through a detector circuit. A pair of probes or electrodes connected between the output of the oscillator and the input of the tank circuit are placed in electrical contact with the pipe sections on opposite sides of the insulator to determine the RF resistance between the pipe sections.

One substantial drawback of the circuit disclosed in Simpson is that it is essentially a so-called "go" or "no-go" indicator. That is, RF resistances exceeding approximately five ohms produce a full scale reading on the instrument and resistances below five ohms produce non-linear readings on the instrument. The output of the instrument is properly characterized as semi-logrithmic and not linear. The circuit, while capable of determining a totally defective insulator is incapable of determining the soundness of an insulator which has not completely deteriorated but will do so in a relatively short period of time.

Similarly, in many instances where the pipe sections are improperly bolted together, such a condition cannot be determined utilizing the circuit disclosed in Simpson.

There is thus the need for an RF resistance testing circuit which produces a precise linear reading of the RF resistance between adjacent nominally insulated pipe sections. Such a circuit will enable the quality of the insulated coupling to be determined, including a failing insulating plate and an improperly bolted coupling.

SUMMARY OF THE INVENTION

One object of the present invention is to provide a new and improved method of and apparatus for determining the RF resistance between a pair of conductive elements.

A further object of the present invention is to provide a new and improved RF resistance measuring apparatus which operates linearly to provide a precise quantitative indication of RF resistance.

A further object of the present invention is to provide a new and improved RF resistance measuring apparatus which is not effected by low level AC or DC voltages.

A further object of the present invention is to provide a new and improved RF resistance measuring apparatus which is capable of obtaining RF resistance measurements precisely within more than one range.

A further object of the present invention is to provide a new and improved RF resistance measuring apparatus which is capable of being precisely calibrated for each range of resistance measurements.

A further object of the present invention is to provide a new and improved RF resistance measuring apparatus which is protected against damage from excessive RF currents.

Finally, it is an object of the present invention to provide a new and improved system for testing conductive elements, for example adjacent pipe sections, which are insulated from one another by an insulating plate or the like to determine the quality of the insulated coupling therebetween.

A method of determining the RF value of a resistance, in accordance with the principles of the present invention, may include the steps of generating an RF signal, impressing a portion of the generated signal through the resistance and converting the remainder of the RF signal to a direct current having a magnitude value of the resistance.

An apparatus for determining the RF value of a resistance, in accordance with the principles of the present invention, may include means for generating an RF signal, means for impressing a portion of the generated signal through the resistance, and means for converting the remainder of the RF signal to a direct current having a magnitude linearly related to the value of the resistance.

The RF signal is converted to DC through a rectifier which is biased for linear operation. Means are provided for amplifying the rectified current by a constant factor to obtain an amplified current directly proportional to the RF resistance being determined, for sensing the value of the amplified current and for varying the amount of rectified current amplified to limit the amplified current to a predetermined maximum when the amplified current exceeds a predetermined value.

The RF current generator may be an oscillator having its output coupled to the rectifier through a filter circuit which smooths the output of the rectifier. A pair of probes for contacting a pair of nominally insulated conductive elements may be connected across the oscillator output. Through a biasing resistor which provides for linear operation of the rectifier. The voltage across the current, rectifying the remainder of the generated RF current, amplifying the rectified current by a constant factor to obtain an amplified current directly proportional to the resistance between the elements, sensing the value of the amplified current and varying the amount of rectified current amplified to limit the amplified current to a maximum when the amplified current exceeds a predetermined value.

An apparatus for determining the RF resistance between a pair of conductive elements, in accordance with the principles of the present invention, may include means for generating an RF current, means for impressing a portion of the generated current through the elements, the amount of the impressed current being inversely proportional to the resistane between the elements and linearly related to the remainder of the generated current, means for rectifying the remainder of the generated RF current, means for amplifying the rectified current by a constant factor to obtain an amplified current directly proportional to the resistance between the elements, means for sensing the value of the amplified current and means for varying the amount of rectified current amplified to limit the amplified current to a maximum when the amplified current exceeds a predetermined value.

The RF current generator may be an oscillator having its output coupled to the rectifier through a filter circuit which filters out low level DC and low frequency AC signals. A pair of probes of contacting the conductive elements may be connected across the oscillator output. The voltage across the probes is directly related to the RF resistance between the elements. The output of the rectifier may be coupled to the input of an operational amplifier having an adjustable gain. The output of the amplifier is coupled to a meter capable of reading the resistance between the probes directly.

A circuit for protecting the meter may include a differential amplifier having a signal input connected across the meter and a reference input held at a potential which may be twice the full scale rated meter voltage. The output of the differential amplifier is connected to the input of the operational amplifier through a normally reverse biased diode. The output of the differential amplifier also may be coupled to the signal input thereof through a forward biased diode. When the voltage across the meter which is sensed at the signal input of the differential amplifier exceeds the voltage at the reference input, the output of the differential amplifier is driven negatively to cause the normally reverse biased rectifier to become forward biased to divert part of the current at the input of the operational amplifier to limit the output thereof, limiting the current through the meter to protect it from damage. When the voltage across the meter is less than the voltage at the reference input of the differential amplifier the output thereof is clamped by the diode connected between the output and the signal input of the differential amplifier.

The probes may be connected across the oscillator output through a selector switch. A plurality of calibrating resistors may be provided which are selectively connectable across the output of the oscillator through the selector switch such that the gain of the operational amplifier may be adjusted for full scale deflection of the meter for each selected calibration resistor.

The apparatus may be adjusted for zero resistance calibration by a potentiometer connected to a source of positive supply voltage for the system to null the output of the operational amplifier when the test probes are shorted together.

BRIEF DESCRIPTION OF THE DRAWINGS

A complete understanding of the present invention will be obtained from the following detailed description of a preferred embodiment thereof, when read in conjunction with the accompanying drawing which shows a system, including an electrical schematic diagram of a circuit for an instrument for measuring the radio frequency resistance between a pair of conductive elements coupled together through an insulator.

DETAILED DESCRIPTION

Referring to FIGURE 1, there is shown a system including an apparatus or circuit 10 representing an instrument for measuring the RF resistance between first and second conductive elements 11 and 12, which may be, for example, adjacent pipe sections of a pipeline separated from one another by an insulating plate or gasket 13. The pipes 11 and 12 may be coupled together through the insulator 13 by suitable means, for example, properly insulated bolts 16 which draw flanges 17 and 18 on the pipes 11 and 12, respectively, together through the insulating gasket 13. The pipe 12 is shown as receiving cathodic protection against corrosion by electrons supplied from a battery 19. The pipe 11 may be protected in a similar manner.

The circuit 10 includes a radio frequency oscillator 20, a half-wave rectification detector and filter circuit 21, and adjustable gain amplifier 22, a meter readout circuit 23 and a meter current limiting circuit 26. First and second test probes or electrodes 27 and 28 are connected to first and second probe terminals 31 and 32, respectively, of the circuit 10.

A selector switch S1, including first and second ganged selector switch sections S1A and S1B is utilized to select the adjustment, calibration and testing functions of the circuit 10.

The oscillator 20 may be a grounded collector Hartley type oscillator which includes N-P-N transistor Q1 having its base-emitter junction connected across a portion of a primary winding 33 of a transformer T1 through a capacitor C1 to feed back a portion of the voltage across the primary winding 33, which forms part of an oscillator output tank circuit with a capacitor C2. The collector 36 of the transistor Q1 is grounded through a bypass capacitor C3 and to a supply line 30 which is connectable to a positive DC supply source B1 through a contact 37 of a DPDT power switch S2. A biasing resistor R1 is connected across the base-collector junction of the transistor Q1.

The operating frequency of the oscillator 20 is preferably 1 Megahertz. The transformer T1 steps down the 1 Mhz output of the oscillator 20 to approximately 2.5 volts appearing across the grounded secondary winding 42 of the transformer T1.

The output of the oscillator 20 is sinusoidal and should be such as to remain constant over a relatively large range of supply voltage and load variations. The transformer T1 provides a low output impedance and isolation between the oscillator 20 and the remainder of the circuit 10.

The RF output of the secondary winding of the transformer T1 is obtained through a current limiting resistor R2. First and second calibration resistors R3 and R4 are selectively connectable across the current limited output of the oscillator 20 through a resistor R5 by a moveable contactor 43 of the selector switch section S1A through terminals 46 and 47 thereof. The resistor R5 alone may be connected across the oscillator output through the contactor 43 and a terminal 51 of the selector switch section S1A and the probes 27 and 28 may be connected thereacross through terminals 52 and 53, respectively, the contactor 43 and the resistor R5.

The purpose of resistor R5 is to ensure that the RF potential at the input of the detector 21 exceeds the threshold level of a half-wave rectifier D1 in the detector circuit 21 such that the rectifier D1 operates over a linear portion of its characteristic operating curve. The input of the detector 21 is obtained through a resistor R6 and a coupling capacitor C4. A filter comprising a resistor R7 and a capacitor C5 filters out undesirable RF ripple from the half-wave rectified output of the detector circuit 21 to smooth the DC output thereof.

The circuit 21 rectifies and filters the output of the oscillator 20 and converts it to a DC potential. This potential is applied to a non-inverting input 56 of an operational amplifier 57 in the amplifier circuit 22. The amplifier 57 is supplied by the positive DC supply line 30 and a negative DC supply line 58 connectable to a negative DC source B2 through a contact 59 of the DPDT switch S2.

An inverting input 60 of the amplifier 57 is connected to ground through two resistors R8 and R9. A zero adjusting potentiometer R10 for the system 10 is connected between the line 30 and ground. A moveable tap 61 on the potentiometer R10 is connected between the resistors R8 and R9. This may be done directly as shown or through a suitable (20,000 ohm) current limiting resistor.

A potentiometer R11, connected as a rheostat, feeds back part of the signal at the output 62 of the amplifier 57 to the inverting input 60 thereof. As will be understood from the discussion below, the potentiometer R10 and the rheostat R11 may be adjusted to calibrate the system 10. The output 62 of the amplifier 57 may be selected to flow through a microammeter M1 through one of two current limiting resistors R12 and R13 in the meter readout circuit 23, depending upon the position of a moveable contactor 63 of the selector switch section S1B. The switch section S1B is provided with terminals 66, 67 and 68, which are connected to the resistor R12 and terminals 71 and 72, which are connected to the resistor R13.

The meter limiting circuit 26 protects the meter M1 from excessive currents which might damage it, since, as will be understood from the discussion below, if the resistance across the probes 27 and 28 is sufficiently high, large RF and DC voltages, respectively, may be introduced into the detector circuit 21 and the amplifier circuit 22. The meter limiting circuit 26 includes an operational amplifier 73, connected to the positive and negative DC supply lines 30 and 58, which operates as a differential amplifier. A reference voltage for the amplifier 73 is established by a voltage divider including a pair of series resistors R14 and R15 connected between the supply line 30 and ground. The output of the voltage divider at the junction of the resistors R14 and R15 is connected to the non-inverting or reference input 76 of the amplifier 73 through a dropping resistor R16. A bypass capacitor C6 is connected between the input 76 of the amplifier 73 and ground.

An inverting or signal input 77 of the amplifier 73 is connected across the meter M1 through a dropping resistor R17. The output 78 of the amplifier 73 is connected to the input 77 thereof through a clamping diode D2, and to the inverting input 56 of the amplifier 57 through a normally reverse-biased diode D3 and a dropping resistor R18. The voltage established at the non-inverting input 76 of the amplifier 73 is selected to be approximately twice the voltage rating of the meter M1. This provides 100 percent overvoltage protection to the meter M1.

TO calibrate the system the switch S2 is closed and resistor R3 or the resistor R4 is switched across the probes 27 and 28 through the contact 43 of the selector switch S1 which also selects the appropriate meter current limiting resistor R12 or R13 through the ganged contact 63 thereof. The amplifier feedback rheostat R11 is then adjusted until the meter M1 reads full scale. The preferred values of R3 and R4 are 10 and 100 ohms, respectively, for calibrating the system 10 for two ranges, 0–10 and 0–100 ohms. For zero calibration the contact 43 of the switch S1 is moved to engage terminal 51 and the probes 27 and 28 are shorted together. The amplifier zero adjustment control potentiometer R10 is then adjusted until the meter M1 reads zero. The adjustment of the potentiometer R10 changes the input voltage at the inverting input 60 of the amplifier 57 until it is at the same potential as the non-inverting input 56 thereof.

In operation the probes 27 and 28 are connected across the pipe sections 11 and 12 to obtain the precise value of the RF resistance across the insulator 13 directly from the appropriate scale on the meter M1.

The output of the oscillator 20 is fed through the resistor R2, across the probes 27 and 28 through resistor R5 to the ground side of the secondary winding 42 of the transformer T1. As mentioned previously, the resistor R5 is necessary to achieve linear operation of the circuit 10.

The RF voltage drop across the probes 27 and 28 and resistor R5 appears at the input of the detector circuit 21 where it is rectified and filtered and appears as a DC potential at the non-inverting input 56 of the amplifier 57. This potential is representative of the produce of the RF current through the probes and resistor R5 and the sum of those resistances.

Part of the current at the output 62 of the amplifier 57 is fed back to the inverting input 60 thereof through the rheostat R11. The current through R11 is sufficient to raise the potential at the inverting input 60 of amplifier 57 to the same potential appearing at the non-inverting input 56 thereof. The remainder of the output current of the amplifier 57 flows into the meter M1 through the resistor R12 or the resistor R13.

A shorted or defective insulator 13 between the pipe sections 11 and 12 is represented by a low RF resistance as well as a low DC resistance and produces a low voltage drop across the probes 27 and 28 and the resistor R5. Similarly, a good insulator 13 represents both a high DC and a high RF resistance and a relatively high voltage drop across the probes 27 and 28 and the resistor R5. The quality of the insulated unit thus may be determined by the readout of the meter M1.

The meter current limiting circuit 26 senses the potential across the meter M1. If the resistors R16 and R17 are selected to be of equal value and the insulation resistance across the probes 27 and 28 is sufficiently high to generate a potential thereacross which tends to drive the potential across the meter M1 higher than the potential appearing at the junction of the resistors R14 and R15, the potential at the output 78 of the amplifier 73 becomes sufficiently negative to cause the diode D3 to conduct in the forward direction.

When the diode D3 conducts, part of the current into the non-inverting input 56 of the amplifier 57 flows through the resistor R18 and the diode D3, decreasing the potential applied to the input 56 of the amplifier 57, and consequently decreasing the output voltage of the amplifier 57 sufficiently to limit the voltage across the meter M1 so that it cannot exceed the potential at the junction of resistors R14 and R15.

When the voltage across the meter drops below the potential at the junction of the resistors R14 and R15, the diode D2 clamps the output 78 of the amplifier 73 to reverse bias the diode D3 and render it non-conductive.

Various values for the circuit components of the circuit 10 may be utilized to obtain satisfactory operation as described above. The values listed below, therefore, should be understood to be exemplary only.

| ELEMENT | VALUE OR MANUFACTURE-CODE |
|---|---|
| 57, 73 | National-LM 307 |
| B1, B2 | RCA-VS1323 (Alkaline) 8.4 vDC |
| C1 | .003 microfarad |
| C2 | 100 micromicrofarads |
| C3 | 25 microfarads |
| C4 | .0005 microfarad |
| C5, C6 | .01 microfarad |
| D1 | 1N34A |
| D2, D3 | 1N459 |
| M1 | Simpson-0 to 100 microampere, taut band |
| Q1 | 2N3904 |
| R1 | 12,000 ohms |
| R2 | 620 ohms |
| R3, R5 | 10 ohms |
| R4, R9 | 100 ohms |
| R6, R10, R11, R18 | 10,000 ohms |
| R7, R14, R16, R17 | 100,000 ohms |
| R8 | 470 ohms |
| R12 | 2200 ohms |
| R13 | 33,000 ohms |
| R15 | 1500 ohms |
| S1 | Centralab-PS104 |
| T1 | Miller-2022 |

Although the method and apparatus of the invention have been described and shown as being particularly suitable for measuring the insulation resistance between adjacently connected pipe sections it will be appreciated that other uses will be obvious to those having ordinary skill in the art which come within the spirit and scope of the invention.

What is claimed is:

1. A method of determining the RF value of a resistance which comprises the steps of:
   generating an RF signal;
   impressing a portion of said RF signal through the resistance; and
   converting the remainder of the RF signal to a direct current having a magnitude linearly related to the resistance.

2. A method of determining the RF value of a resistance in accordance with claim 1 and including the steps of:
   amplifying the direct current;
   sensing the value of said amplified current; and
   varying the amount of said direct current amplified to limit the amplified current to a predetermined maximum.

3. An apparatus for determining the RF value of a resistance which comprises:
   means for generating an RF signal;
   means in circuit with the generating means for impressing a portion of the generated signal through the resistance; and
   means in circuit with the generating means for converting the remainder of the RF signal to a direct current having a magnitude linearly related to the resistance.

4. An apparatus according to claim 3 and including:
   means in circuit with the converting means for amplifying the direct current;
   means in circuit with the amplifying means for sensing the value of said amplified current; and
   means in circuit with the amplifying means for varying the amount of the direct current amplified to limit the amplified current to a predetermined value.

5. An apparatus for determining the RF resistance between first and second conductive elements which comprises:
   an oscillator for generating a radio frequency signal;
   a rectifier;
   means coupling the output of said oscillator to said rectifier;
   means for connecting the conductive elements across the output of said oscillator to divert a portion of the output signal of said oscillator through the conductive elements, said portion being proportional to the resistance between the elements and linearly related to the undiverted portion of the oscillator output;
   an amplifier coupled to the output of said rectifier for amplifying the rectified signal by a constant factor to obtain an amplified current indicative of the resistance between the elements; and
   a meter coupled to the output of said amplifier for measuring the amplified current.

6. An apparatus as set forth in claim 5 wherein said rectifier is a semiconductor diode and said connecting means includes means for operating said diode along a linear portion of its characteristic curve.

7. An apparatus as set forth in claim 5 and including:
   means for sensing the voltage across said meter and responsive to a voltage across said meter exceeding a predetermined value to vary the amount of current at the input of said amplifier to limit the voltage across the meter to a maximum.

8. An apparatus as set forth in claim 7 wherein said sensing means includes:
   a differential amplifier having a signal input and a reference input;
   means for impressing the voltage across said meter on said signal input of said differential amplifier;

means for impressing a potential equal to said maximum potential at the reference input of said differential amplifier, whereby the output of said differential amplifier decreases when the potential at said signal input exceeds the potential at said reference input;

first feedback rectifying means for connecting the output of said differential amplifier to the signal input thereof for clamping the output of said differential amplifier when the potential impressed on said signal input thereof is less than the potential impressed on the reference input thereof; and second feedback rectifying means coupling the input of said amplifier to the output of said differential amplifier, said second feedback rectifying means being forward biased to conduct to decrease the current input of said amplifier when the potential impressed on the signal input of said differential amplifier tends to exceed the potential impressed on said reference input of said differential amplifier to limit the current through said meter.

9. An apparatus as set forth in claim 7 and including:
means for adjusting the gain of said amplifier;
a plurality of calibrating resistors;
switching means for selectively connecting said calibrating resistors across the output of said oscillator and for selectively disconnecting said element connecting means, whereby the output of said amplifier may be adjusted to produce a full scale deflection of said meter for each selected calibrating resistor.

10. An apparatus as set forth in claim 9 and including means for filtering the RF current applied to the input of said rectifier.

11. An apparatus for determining the RF value of an unknown resistance, which comprises:
an oscillator for generating an RF signal;
means in circuit with the oscillator for converting said RF signal to a direct current;
means for connecting an unknown resistance across the output of said oscillator to produce a direct current linearly related to said unknown resistance;
current indicating means; and
means responsive to said direct current for driving said current indicating means to indicate the value of the unknown resistance.

12. An apparatus according to claim 11 wherein said converting means is a semiconductor diode and said connecting means includes means for establishing a linear relationship between the current through and the voltage across said diode.

13. An instrument for determining the quality of an insulated coupling by measuring the value of the RF resistance of the insulation which comprises:

first and second conductive probes for engaging the opposite sides of said coupling;
an RF oscillator;
a rectifier coupled to the output of said oscillator for converting the RF output thereof to direct current;
an operational amplifer having an inverting input, a non-inverting input and an output;
means coupling said rectifier to the non-inverting input of said operational amplifier to amplify the direct current;
an adjustable feedback resistor connecting the output of said operational amplifier to the inverting input thereof for varying the gain of said operational amplifier;
a current meter;
means for connecting the output of said operational amplifier to said meter;
a differential amplifier having a signal input, a reference input and an output;
means for establishing a predetermined potential at the reference input of said differential amplifer;
means for connecting the meter to the signal input of said differential amplifier to sense the potential across said meter;
a first diode coupling the output of said differential amplifier to the non-inverting input of said operational amplifier, said diode being reverse-biased when the sensed meter potential is below said predetermined potential and being forward-biased when the sensed meter potential exceeds said predetermimed potential;
a second diode connecting the output of said differential amplifier to the signal input thereof and being reverse biased to clamp the output of said differential amplifier when the sensed meter potential is below said predetermined potential and being forward biased when said sensed meter potential exceeds said predetermined potential;
a calibration resistance;
a biasing resistance for establishing linear operation of said rectifier; and
means for selectively connecting said calibration resistance across the output of said oscillator through said biasing resistance to permit the gain of said operational amplifier to be adjusted to adjust the meter current to a value proportional to said calibration resistance and for selectively connecting said probes across the output of said oscillator through said biasing resistance to establish a meter current proportional to the resistance of said insulated coupling and linearly related to said calibration resistance.

* * * * *